(12) United States Patent
Itokawa et al.

(10) Patent No.: US 7,986,013 B2
(45) Date of Patent: Jul. 26, 2011

(54) SEMICONDUCTOR DEVICE HAVING SIGE SEMICONDUCTOR REGIONS

(75) Inventors: Hiroshi Itokawa, Yokohama (JP); Ichiro Mizushima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 243 days.

(21) Appl. No.: 12/271,102

(22) Filed: Nov. 14, 2008

(65) Prior Publication Data

US 2009/0152622 A1 Jun. 18, 2009

(30) Foreign Application Priority Data

Nov. 15, 2007 (JP) ................................. 2007-297022

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/369; 257/328; 257/E27.062

(58) Field of Classification Search .................. 257/369, 257/384, 382, 383, E27.06, E27.062
See application file for complete search history.

(56) References Cited

U.S. PATENT DOCUMENTS 6,492,216 B1  12/2002  Yeo et al.

2005/0116360 A1  6/2005  Huang et al.
2007/0200179 A1  8/2007  Chen
2010/0001317 A1*  1/2010  Chen et al. ................... 257/192

FOREIGN PATENT DOCUMENTS

JP  2006-229071  8/2006

OTHER PUBLICATIONS

Zaima et al., "Interfacial Reaction and Electrical Properties in Ni/Si and Ni/SiGe(C) Contacts", Applied Surface Science, vol. 224, pp. 215-221, (2004).

Nakatsuka et al., "Improvement in NiSi/Si Contact Properties With C-Implantation", Microelectric Engineering, vol. 82, pp. 479-484, (2005).

* cited by examiner

*Primary Examiner* — Hoai v Pham
(74) *Attorney, Agent, or Firm* — Finnegan, Henderson, Farabow, Garrett & Dunner, L.L.P.

(57) ABSTRACT

A semiconductor device includes a first semiconductor region having a channel region, and containing silicon as a main component, second semiconductor regions sandwiching the first semiconductor region, formed of SiGe, and applying stress to the first semiconductor region, cap layers provided on the second semiconductor regions, and formed of silicon containing carbon or SiGe containing carbon, and silicide layers provided on the cap layers, and formed of nickel silicide or nickel-platinum alloy silicide.

5 Claims, 5 Drawing Sheets

100nm

100nm

US 7,986,013 B2

SEMICONDUCTOR DEVICE HAVING SIGE SEMICONDUCTOR REGIONS

CROSS-REFERENCE TO RELATED APPLICATIONS

This application is based upon and claims the benefit of priority from prior Japanese Patent Application No. 2007-297022, filed Nov. 15, 2007, the entire contents of which are incorporated herein by reference.

BACKGROUND OF THE INVENTION

1. Field of the Invention

The present invention relates to a semiconductor device.

2. Description of the Related Art

Considering high performance of a semiconductor integrated circuit device, a technique of applying stress to a channel region has been proposed (e.g., see Jpn. Pat. Appln. KOKAI Publication No. 2006-229071). For example, a channel region is sandwiched between SiGe layers, and thereby, compression stress is applied to the channel region. Thus, this serves to increase a hole mobility of a p-type MIS transistor.

However, when a silicide layer is formed on the SiGe layer, it is difficult to apply sufficient stress to the channel region, and to obtain a preferable silicide layer.

BRIEF SUMMARY OF THE INVENTION

A first aspect of the present invention, there is provided a semiconductor device comprising: a first semiconductor region having a channel region, and containing silicon as a main component; second semiconductor regions sandwiching the first semiconductor region, formed of SiGe, and applying stress to the first semiconductor region; cap layers provided on the second semiconductor regions, and formed of silicon containing carbon or SiGe containing carbon; and silicide layers provided on the cap layers, and formed of nickel silicide or nickel-platinum alloy silicide.

A second aspect of the present invention, there is provided a semiconductor device comprising: a first semiconductor region having a channel region, and containing silicon as a main component; second semiconductor regions sandwiching the first semiconductor region, formed of SiGe containing carbon whose concentration increases from a bottom portion toward a top portion of the second semiconductor region, and applying stress to the first semiconductor region; and silicide layers provided on the second semiconductor regions, and formed of nickel silicide or nickel-platinum alloy silicide.

DETAILED DESCRIPTION OF THE INVENTION

Various embodiments of the present invention will be hereinafter described with reference to the accompanying drawings.

Embodiment 1

Figure 1:
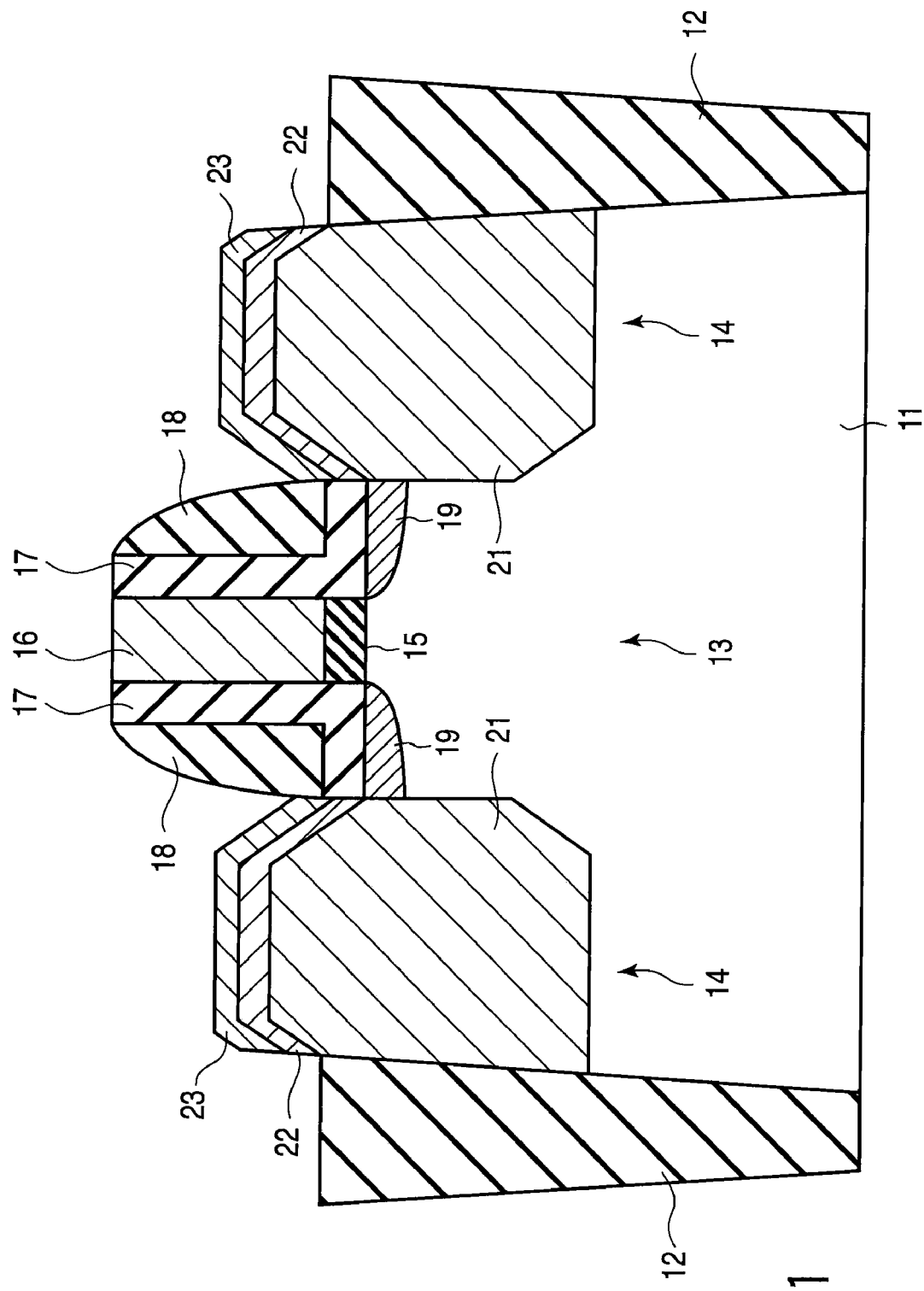
FIG. 1 is a cross-sectional view schematically showing the structure of a semiconductor device according to first and second embodiments of the present invention.

FIG. 1 is a cross-sectional view schematically showing the structure of a semiconductor device according to a first embodiment of the present invention.

As shown in FIG. 1, the surface area of a silicon substrate (semiconductor substrate) 11 is formed with an isolation insulating region 12. A p-type MIS transistor is formed at an element region surrounded by the isolation insulating region 12.

The element region includes a first semiconductor region 13 having a channel region. The first semiconductor region 13 corresponds to a convex-shaped region defined by a trench 14. A gate insulating film 15 is formed on the first semiconductor region 13. A gate electrode 16 is formed on the gate insulating film 15. The sidewall of the gate electrode 16 is formed with a sidewall oxide film (silicon oxide film) 17 and a sidewall nitride film (silicon nitride film) 18. The first semiconductor region 13 is formed with extension regions 19 containing p-type impurity at the vicinity of upper both ends. A portion sandwiched between the foregoing extension regions 19 corresponds to a channel region.

The trench 14 is provided with a second semiconductor region 21 formed of SiGe. The first semiconductor region 13 is sandwiched between the second semiconductor regions 21 to apply stress to the first semiconductor region 13. The second semiconductor region 21 contains p-type impurity such as boron (B). The second semiconductor regions 21 substantially function as source/drain regions. Stress is applied to the first semiconductor region 13 by the second semiconductor region 21, and thereby, the mobility of hole passing through the channel region increases. This serves to improve an operation speed of a p-type MIS transistor.

A cap layer 22 formed of silicon (Si) containing carbon (C) is provided on the second semiconductor region 21. The carbon concentration of the cap layer 22 is lower than the germanium concentration of the second semiconductor region 21. More specifically, the carbon concentration of the cap layer 22 is sufficiently lower than 1/10 of the germanium concentration of the second semiconductor region 21.

A silicide layer 23 is provided on the cap layer 22. The silicide layer 23 is formed of nickel silicide (Ni silicide) containing nickel (Ni) and silicon (Si) as a main component. The silicide layer 23 may be formed of nickel-platinum alloy silicide (Ni—Pt alloy silicide) containing nickel (Ni), platinum (Pt) and silicon (Si) as a main component. Carbon is usually contained in the silicide layer 23. Usually, the silicide layer 23 substantially does not contain germanium (Ge).

The following is an explanation about a method of forming the second semiconductor region 21, the cap layer 22 and the silicide layer 23.

First, a structure having an isolation insulating region 12, a gate structure (gate insulating film 15, gate electrode 16, sidewall oxide film 17, sidewall nitride film 18) and an extension region 19 is previously formed. Thereafter, a silicon substrate 11 is formed with a trench 14, and then, a second semiconductor region 21 is selectively formed in the trench 14. Specifically, a SiGe layer is formed as the second semiconductor region 21 by epitaxial growth. Incidentally, p-type impurity (boron) may be introduced into the second semiconductor region 21 during the epitaxial growth of the SiGe layer.

The p-type impurity (boron) may be introduced using ion implantation after the epitaxial growth of the SiGe layer.

A silicon layer containing carbon is selectively formed on the second semiconductor region 21 by epitaxial growth. Then, a nickel film (or nickel-platinum alloy film) is formed on the entire surface. Heat treatment is further carried out so that the silicon layer containing carbon reacts with the nickel film (or nickel-platinum alloy film). In this case, only the upper portion of the silicon layer containing carbon is acted so that the lower portion has no reaction. Thereafter, the nickel film (or nickel-platinum alloy film) having no reaction is removed. As a result, it is possible to obtain a silicide layer 23 formed of nickel silicide (or nickel-platinum alloy silicide). In addition, a cap layer 22 formed of a silicon layer containing carbon is obtained between the second semiconductor region 21 and the silicide layer 23. Incidentally, it is confirmed by analysis that the silicide layer 23 contains carbon, but does not contain germanium.

In this way, a semiconductor device having the structure shown in FIG. 1 is obtained.

As described above, according to this embodiment, the cap layer 22 formed of silicon containing carbon is provided on the second semiconductor region 21 formed of SiGe. Further, the silicide layer 23 formed of nickel silicide (or nickel-platinum alloy silicide) is formed on the cap layer 22. The foregoing structure is provided, and thereby, the following advantage is obtained. Specifically, it is possible to obtain a semiconductor device, which applies sufficient stress to the first semiconductor region 13 having the channel region, and has the silicide layer 23 excellent in thermal stability.

As described later, the silicide layer 23 formed of nickel silicide (or nickel-platinum alloy silicide) is formed on the cap layer 22 formed of silicon containing carbon, and thereby, this serves to improve the thermal stability of the silicide layer 23. However, if the second semiconductor region 21 formed of SiGe contains carbon, the extension of SiGe is limited by carbon. Because, the carbon contained in SiGe acts on a direction of compressing SiGe. As a result, it is impossible to apply sufficient stress to the first semiconductor region 13. According to this embodiment, the cap layer 22 contains carbon, but the second semiconductor region 21 does not contain carbon. Thus, it is possible to improve the thermal stability of the silicide layer 23, and to apply sufficient stress to the first semiconductor region 13.

The following advantage will be described. Namely, a silicide layer formed of nickel silicide (or nickel-platinum alloy silicide) is formed on a silicon region (silicon layer) containing carbon, and thereby, the thermal stability of the silicide layer is improved.

Figure 2:
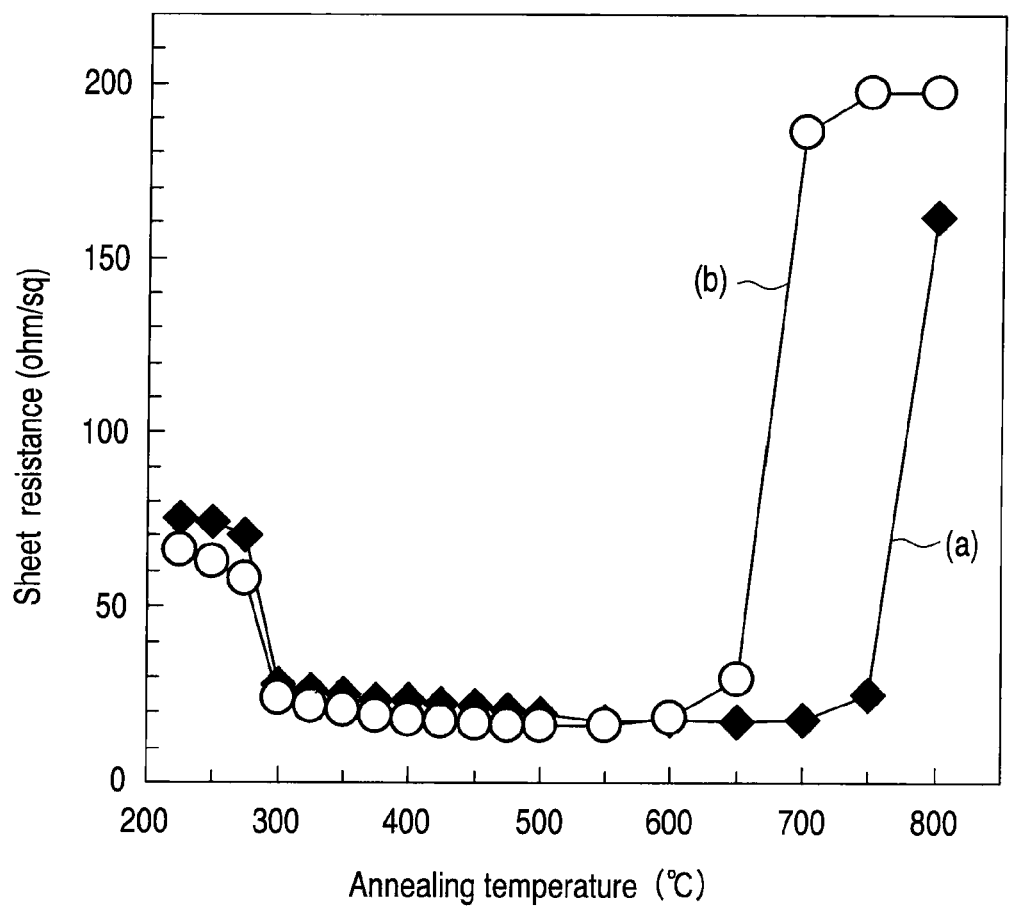
FIG. 2 is a graph to explain the relationship between annealing temperature of a silicide layer and a sheet resistance thereof.

FIG. 2 is a graph showing the relationship between annealing temperature when forming a silicide layer and a sheet resistance of the formed silicide layer. In FIG. 2, a symbol (a) denotes the measured result of a sample based on the embodiment, and a symbol (b) denotes the measured result of a sample according to comparison example. The sample based of the embodiment is formed in the following manner. Specifically, a nickel-platinum alloy silicide layer is formed on a single crystal silicon substrate (having carbon concentration of 0.7%) doped with carbon. The sample based on the comparison example is formed in the following manner. Specifically, a nickel-platinum alloy silicide layer is formed on a single crystal silicon substrate doped with no carbon. First, a nickel-platinum alloy film having a thickness of 8 nm is formed on the single crystal silicon substrate using sputtering at a temperature of 200° C. Thereafter, a rapid thermal annealing (RTA) treatment using a halogen lamp is carried out (temperature: 225 to 800° C., time: 30 seconds) to form a nickel-platinum alloy silicide layer.

As seen from the measured result of FIG. 2, according to the sample of the comparison example, a sheet resistance rapidly increases when the annealing temperature is about 650° C. or more. This is a factor of reducing the thermal stability of the nickel-platinum alloy silicide layer. Specifically, a mono-silicide is formed at annealing temperature lower than about 650° C. However, a die-silicide having high resistance is formed at annealing temperature higher than about 650° C. This is given as a factor of reducing the thermal stability. Further, aggregation and abnormal growth of silicide are likely to occur at annealing temperature higher than about 650° C. This is also given as a factor of reducing the thermal stability.

On the contrary, according to the sample based on the embodiment, a low sheet resistance is maintained until the annealing temperature reaches about 750° C. In other words, the thermal stability of the nickel-platinum alloy silicide layer is improved. Therefore, the nickel-platinum alloy silicide layer is formed on the silicon region (silicon layer) doped with carbon, and thereby, the thermal stability of the silicide layer is improved. In this case, even if a nickel silicide layer is formed in place of the nickel-platinum alloy silicide layer, the thermal stability of the silicide layer is improved likewise.

Figure 3A:
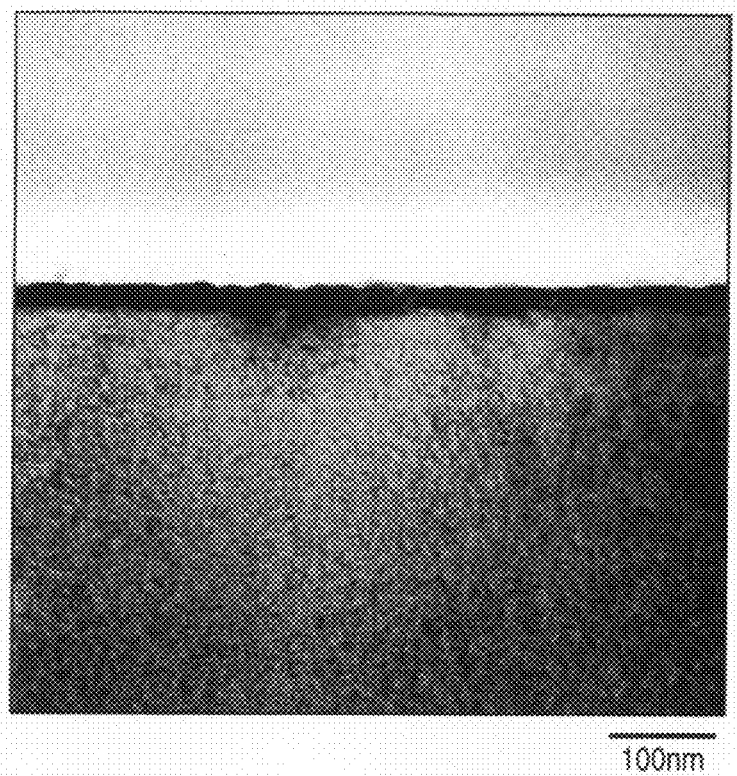
FIG. 3A and FIG. 3B are TEM photographs of a silicide layer based on the first embodiment of the present invention.
Figure 3B:
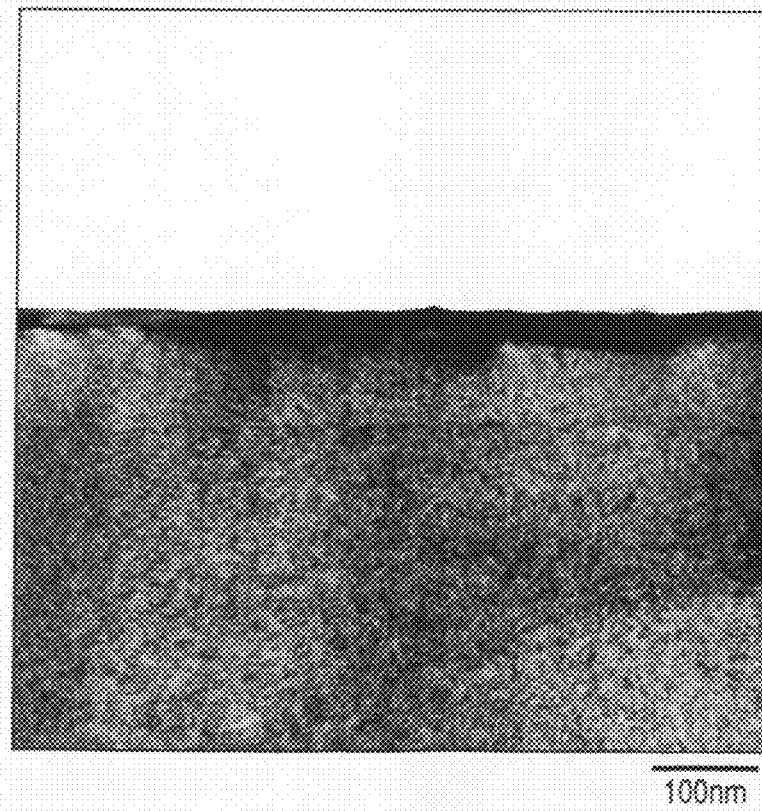
Figure 4A:
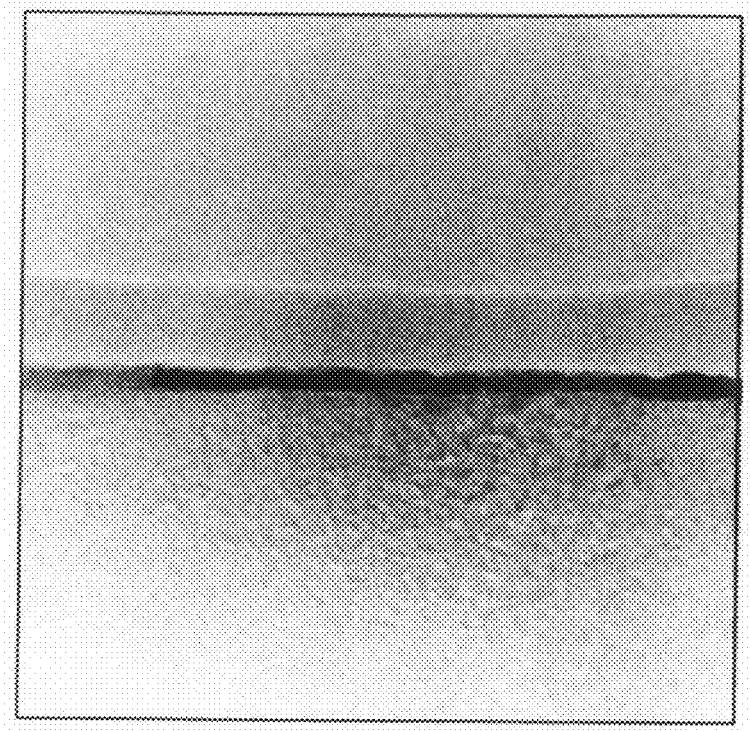
FIG. 4A and FIG. 4B are TEM photographs of a silicide layer based on a comparison example of the first embodiment of the present invention.
Figure 4B:
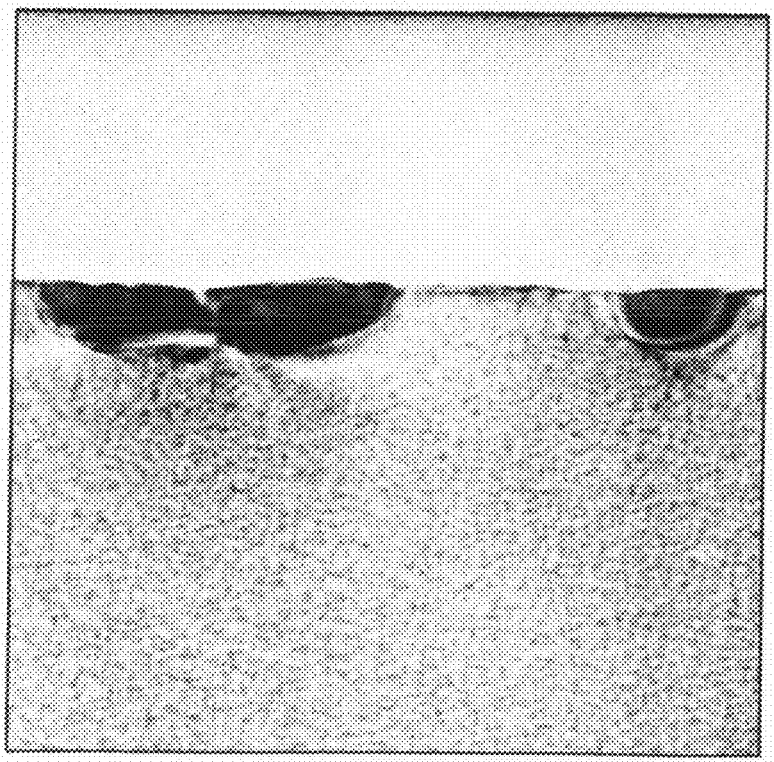

FIGS. 3A and 3B and FIGS. 4A and 4B are sectional TEM photographs of the silicide layer formed on the single crystal silicon substrate. FIGS. 3A and 3B are TEM photographs of the sample based on the embodiment, and FIGS. 4A and 4B are TEM photographs of the sample according to the comparison example. The sample based on the embodiment is prepared in a manner that the nickel-platinum alloy silicide layer is formed on the single crystal silicon substrate doped with carbon (carbon concentration: 0.7%). The sample of the comparison example is prepared in a manner that the nickel-platinum alloy silicide layer is formed on the single crystal silicon substrate doped with no carbon. The foregoing two samples are prepared in the following manner. First, a nickel-platinum alloy film having a thickness of about 8 nm is formed on a single crystal silicon substrate using sputtering at temperature 200° C. Thereafter, a rapid thermal annealing (RTA) treatment using a halogen lamp is carried out (temperature: 550° C. and 750° C., time: 30 seconds) to form a nickel-platinum alloy silicide layer. FIG. 3A and FIG. 4A are the cases when the RTA treatment temperature is 550° C. FIG. 3B and FIG. 4B are the cases when the RTA treatment temperature is 750° C.

As seen from FIGS. 4A and 4B, in the sample of the comparison example, a uniformly preferable poly-crystal nickel-platinum alloy silicide layer is obtained at the annealing temperature 550° C. However, nickel-platinum alloy silicide aggregates at the annealing temperature 750° C.; for this reason, a preferable poly-crystal nickel-platinum alloy silicide layer is not obtained. Therefore, the thermal stability of the silicide layer is reduced.

On the contrary, according the sample based on the embodiment, even if both cases where the annealing temperature is 550° C. and 750° C. are given, a uniformly preferable poly-crystal nickel-platinum alloy silicide layer is obtained. In other words, according the sample based on the embodiment, the thermal stability of the nickel-platinum alloy silicide layer is improved. Therefore, the nickel-platinum alloy silicide layer is formed on the silicon region (silicon layer) doped with carbon, and thereby, the thermal stability of the silicide layer is improved. Incidentally, even if a nickel silicide layer is formed in place of the nickel-platinum alloy silicide layer, the thermal stability of the silicide layer is improved likewise.

The foregoing advantage is expected from the following documents A and B. Namely, a silicide layer formed of nickel silicide (or nickel-platinum alloy silicide) is formed on the silicon region (silicon layer) doped with carbon, and thereby, the thermal stability of the silicide layer is improved.

Document A: (S. Zaima et al., Appl. Surf. Sci., 224 (2004) 215-221)

Document B: (Nakatsuka et al., Microelectron. Eng., 82 (2005) 479-484)

The foregoing documents have the following description. Specifically, nickel silicide is formed on single crystal silicon doped with carbon (or single crystal SiGe doped with carbon), and thereby, the thermal stability of the nickel silicide is improved.

The following is an explanation about the relationship between germanium concentration of a SiGe layer (corresponding to the second semiconductor region 21 in this embodiment) and carbon concentration of a silicon layer containing carbon (corresponding to the cap layer 22 in this embodiment).

Single crystal B (e.g., single crystal SiGe or single crystal silicon doped with carbon) having a lattice constant different from single crystal A is epitaxially grown on single crystal A (e.g., single crystal silicon). In this case, lattice mismatch is absorbed by elastic deformation of the lattice without dislocation until the epitaxial growth layer has a certain thickness. In this case, the lattice constant of the single crystal B coincides with that of the single crystal A in a direction vertical to the thickness direction (epitaxial growth direction). However, the lattice constant of the single crystal B increases or decreases by elastic deformation in the thickness direction (epitaxial growth direction). The foregoing epitaxial growth is call coherent growth, and the epitaxial growth layer receives biaxial-strain in a direction vertical to the thickness direction.

Here, the coherent growth of single crystal SiGe and single crystal silicon doped with carbon should be considered. A lattice constant and an elastic constant are considered in a free state of both single crystals. If germanium concentration (e.g., 10%) of the single crystal SiGe is about ten times as much as carbon concentration (e.g., 1%) of the single crystal silicon doped with carbon, the absolute value of strain of both single crystals is approximately the same. In other words, the elongation of the single crystal SiGe is approximately the same as the shrinkage of the single crystal silicon doped with carbon.

Considering the foregoing point, preferably, the following condition should be satisfied. Specifically, the cap layer 22 formed of silicon containing carbon is formed on the second semiconductor region 21 formed of SiGe. In this case, the carbon concentration of the cap layer 22 is set lower than $1/10$ of the germanium concentration of the second semiconductor region 21. In other words, the second semiconductor region 21 must be extended in order to apply compression stress to the first semiconductor region 13 so that hole mobility increases. However, considering the foregoing discussion, if the carbon concentration of the cap layer 22 becomes higher than $1/10$ of the germanium concentration of the second semiconductor region 21, the extension of the second semiconductor region 21 is largely limited. Thus, the carbon concentration of the cap layer 22 is set lower than $1/10$ of the germanium concentration of the second semiconductor region 21. In this way, sufficient compression stress is applied to the first semiconductor region 13, and the hole mobility of a p-type MIS transistor is improved.

Embodiment 2

A semiconductor device according to a second embodiment of the present invention will be hereinafter described. In this case, the basic structure and manufacturing method are the same as the first embodiment. Thus, an explanation about the matters described in the first embodiment is omitted. The drawing uses FIG. 1 shown in the first embodiment.

According to this embodiment, a cap layer 22 is formed of SiGe containing carbon (C). The carbon concentration of the cap layer 22 is lower than the germanium concentration of a second semiconductor region 21. More specifically, the carbon concentration of the cap layer 22 is sufficiently lower than $1/10$ of the germanium concentration of a second semiconductor region 21. Other basic structure is the same as the first embodiment. Specifically, a silicide layer 23 is formed of nickel silicide (Ni silicide) or nickel-platinum alloy silicide (Ni—Pt alloy silicide). Usually, the silicide layer 23 contains carbon, but does not substantially contain germanium.

As described above, according to this embodiment, the cap layer 22 formed of SiGe containing carbon is formed on the second semiconductor region 21 formed of SiGe. The silicide layer 23 formed of nickel silicide (or nickel-platinum alloy silicide) is formed on the cap layer 22. Therefore, it is possible to obtain a semiconductor device, which can apply sufficient stress to the first semiconductor region 13 having the channel region, and has the silicide layer 23 excellent in thermal stability, like the first embodiment.

In addition, the carbon concentration of the cap layer 22 is set lower than the germanium concentration of the second semiconductor region 21 (preferably, the carbon concentration of the cap layer 22 is set lower than $1/10$ of the germanium concentration of the second semiconductor region 21), like the first embodiment. In this way, sufficient compression stress is applied to the first semiconductor region 13, and the hole mobility of a p-type MIS transistor is improved.

Embodiment 3

A semiconductor device according to a third embodiment of the present invention will be hereinafter described. In this case, the basic structure and manufacturing method are the same as the first embodiment. Thus, an explanation about the matters described in the first embodiment is omitted.

Figure 5:
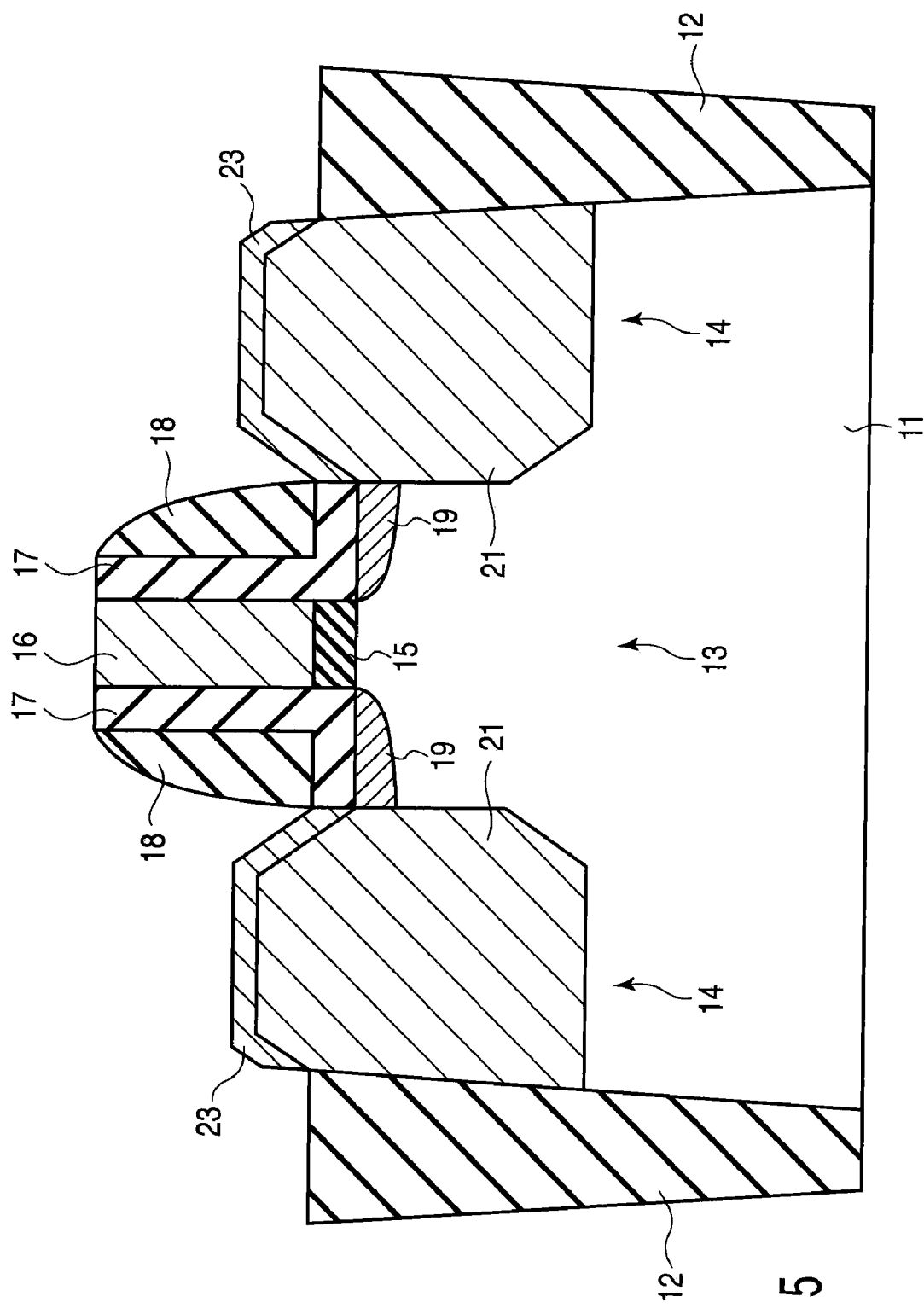
FIG. 5 is a cross-sectional view schematically showing the structure of a semiconductor device according to a third embodiment of the present invention.

FIG. 5 is a cross-sectional view schematically showing the structure of a semiconductor device according to a third embodiment. The basic structure of the semiconductor device shown in FIG. 5 is the same as shown in FIG. 1. The same reference numerals are used to designate portions corresponding to FIG. 1, and the details are omitted.

According to this embodiment, a second semiconductor region 21 formed of SiGe contains carbon, and the carbon concentration increases in the thickness direction of the second semiconductor region 21. In other words, the carbon concentration increases from the bottom portion of the second semiconductor region 21 toward the top portion thereof. The carbon concentration of the uppermost portion of the second semiconductor region 21 is lower than the germanium concentration of the second semiconductor region 21. More specifically, the carbon concentration of the uppermost portion of the second semiconductor region 21 is lower than $1/10$ of the germanium concentration of the second semiconductor region 21.

According to this embodiment, a silicide layer 23 is directly formed on the second semiconductor region 21. The silicide layer 23 is formed of nickel silicide (Ni silicide) or nickel-platinum alloy silicide (Ni—Pt alloy silicide). Usually, the silicide layer 23 contains carbon, but does not substantially contain germanium.

A method of forming the second semiconductor region 21 and the silicide layer 23 will be described below.

First, a structure having an isolation insulating region 12, a gate structure (gate insulating film 15, gate electrode 16, sidewall oxide film 17, sidewall nitride film 18) and an extension region 19 is previously formed. Thereafter, a silicon substrate 11 is formed with a trench 14, and then, a second semiconductor region 21 is selectively formed in the trench 14. Specifically, a SiGe layer containing carbon is formed as the semiconductor region 21 by epitaxial growth. During the epitaxial growth, the concentration of carbon source is increased in a deposition atmosphere, and thereby, the carbon concentration of the second semiconductor region 21 is increased in the thickness direction. Incidentally, p-type impurity (boron) may be introduced to the second semiconductor region 21 during the epitaxial growth of the SiGe layer. Moreover, ion implantation may be carried out after the epitaxial growth of the SiGe layer.

Then, a nickel film (or nickel-platinum alloy film) is formed on the entire surface. Heat treatment is further carried out so that a SiGe layer containing carbon reacts with the nickel film (or nickel-platinum alloy film). Thereafter, no-reacted nickel film (or nickel-platinum alloy film) is removed. As a result, a silicide layer 23 formed of nickel silicide (or nickel-platinum alloy silicide) is obtained on the second semiconductor region 21.

As described above, according to this embodiment, the silicide layer 23 formed of nickel silicide (or nickel-platinum alloy silicide) is provided on the second semiconductor region 21 formed of SiGe containing carbon whose concentration increases in the thickness direction. In this way, it is possible to obtain a semiconductor device, which can apply sufficient stress to the first semiconductor region 13 having the channel region, and has the silicide layer 23 excellent in thermal stability, like the first embodiment.

Specifically, the carbon concentration is relatively high on the upper side of the second semiconductor region 21. Thus, this serves to improve the thermal stability of the silicide layer 23 formed of nickel silicide (or nickel-platinum alloy silicide). Conversely, the carbon concentration is relatively low on the lower side of the second semiconductor region 21. Thus, this serves to apply sufficient stress to the first semiconductor region 13. Therefore, the thermal stability of the silicide layer 23 is improved, and sufficient stress is applied to the first semiconductor region 13.

According to the foregoing first to third embodiments, the first semiconductor region 13 is formed of silicon. In this case, any materials may be used so long as the first semiconductor region 13 is formed of a semiconductor containing silicon as a main component. For example, at least channel region of the first semiconductor region 13 may be formed of SiGe having germanium concentration different from the germanium concentration of the second semiconductor region 21.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first semiconductor region having a channel region, and containing silicon as a main component;
   second semiconductor regions sandwiching the first semiconductor region, formed of SiGe containing carbon, and applying stress to the first semiconductor region, wherein a carbon concentration of the second semiconductor regions increases from a bottom portion toward a top portion of each of the second semiconductor regions, and wherein a carbon concentration of the uppermost portion of the second semiconductor regions is lower than a germanium concentration of the second semiconductor regions; and
   silicide layers provided on the second semiconductor regions, and formed of nickel silicide or nickel-platinum alloy silicide.

2. The device according to claim 1, wherein the silicide layer contains carbon.

3. The device according to claim 1, wherein the second semiconductor regions contain an impurity element.

4. The device according to claim 1, wherein a gate electrode is formed on the first semiconductor region with a gate insulating film interposed therebetween.

5. The device according to claim 1, wherein the second semiconductor regions function as source/drain regions.

* * * * *